United States Patent
Nguyen et al.

(10) Patent No.: US 7,115,534 B2
(45) Date of Patent: Oct. 3, 2006

(54) DIELECTRIC MATERIALS TO PREVENT PHOTORESIST POISONING

(75) Inventors: Son Van Nguyen, Los Gatos, CA (US); Michael D. Armacost, San Jose, CA (US); Mehul Naik, San Jose, CA (US); Girish A. Dixit, San Jose, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/847,891

(22) Filed: May 18, 2004

(65) Prior Publication Data

US 2005/0014361 A1    Jan. 20, 2005

Related U.S. Application Data

(60) Provisional application No. 60/471,609, filed on May 19, 2003.

(51) Int. Cl.
*H01L 21/31* (2006.01)
*H01L 21/469* (2006.01)

(52) U.S. Cl. .............. 438/789; 438/790; 427/255.28; 257/E21.478

(58) Field of Classification Search .......... 438/758, 438/790, 789; 257/E21.478; 427/255.28, 427/255.37

See application file for complete search history.

(56) References Cited

U.S. PATENT DOCUMENTS

| | | | |
|---|---|---|---|
| 4,636,440 A * | 1/1987 | Jada .................. | 428/446 |
| 5,100,503 A * | 3/1992 | Allman et al. ........ | 438/694 |
| 5,593,741 A * | 1/1997 | Ikeda ................. | 427/579 |
| 6,209,484 B1 | 4/2001 | Huang et al. | |
| 6,316,167 B1 * | 11/2001 | Angelopoulos et al. .... | 430/313 |
| 6,329,118 B1 | 12/2001 | Hussein et al. | |
| 6,365,529 B1 | 4/2002 | Hussein et al. | |
| 6,413,852 B1 | 7/2002 | Grill et al. | |
| 6,458,689 B1 * | 10/2002 | Yu et al. ............. | 438/631 |
| 6,506,497 B1 | 1/2003 | Kennedy et al. | |
| 6,812,131 B1 * | 11/2004 | Kennedy et al. ....... | 438/623 |
| 2001/0036748 A1 | 11/2001 | Rutter et al. | |

FOREIGN PATENT DOCUMENTS

EP    0 905 565 A1    3/1999

OTHER PUBLICATIONS

Hussein, et al. " A Novel Approach to Dual Damascene Patterning" Proceedings of IEEE, Jun. (2001) pp. 18-21.
Havemann, et al. "High-Performance Interconnects: An Integration" Proceedings of the IEEE, vol. 89. No. 5. May (2001) pp. 856-601.

(Continued)

*Primary Examiner*—Caridad Everhart
(74) *Attorney, Agent, or Firm*—Patterson and Sheridan

(57) ABSTRACT

Methods are provided for depositing a dielectric material for use as an anti-reflective coating and sacrificial dielectric material in damascene formation. In one aspect, a process is provided for processing a substrate including depositing an acidic dielectric layer on the substrate by reacting an oxygen-containing organosilicon compound and an acidic compound, depositing a photoresist material on the acidic dielectric layer, and patterning the photoresist layer. The acidic dielectric layer may be used as a sacrificial layer in forming a feature definition by etching a partial feature definition, depositing the acidic dielectric material, etching the remainder of the feature definition, and then removing the acidic dielectric material to form a feature definition.

21 Claims, 5 Drawing Sheets

OTHER PUBLICATIONS

Pollentier, et al. "Dual Damascene Back-end Patterning Using 248nm and 193nm Lithography" Semiconductor Fabtech—13th Edition, pp. 227-234.

Peterson, et al. "Approaches to Reducing Edge Roughness and Substrate Poisoning of ESCAP Photoresists", Semiconductor Fabtech—8th Edition, pp. 183-188.

Kinkead, et al. "Prevention of Optics and Resist Contamination of 300mn Lithography-Improvements in Chemical Air Filtration", Proceedings of SPIE (2001) 14 pages.

Ruede, et al. "Molecular Base Sensitivity Studies of Various DUV Resists Used in Semiconductor Fabrication" Proceedings of SPIE (2001) 9 pages.

PCT International Search Report for PCT/US2004/015531 dated Jan. 5, 2005. (AMAT/8015PC).

PCT Written Opinion for PCT/US2004/015531 dated Jan. 5, 2005. (AMAT/8015PC).

PCT Invitation to Pay Additional Fees for PCT/US04/015531 dated Nov. 5, 2004. (AMAT/8015PCT).

PCT Notification Concerning Transmittal of Copy of International Preliminary Report on Patentability for International Application No. PCT/US04/015531 dated Dec. 8, 2005. (APPM/008015PC).

PCT Written Opinion for International Application No. PCT/US04/015531 dated Dec. 8, 2005. (APPM/008015PC).

* cited by examiner

DIELECTRIC MATERIALS TO PREVENT PHOTORESIST POISONING

CROSS-REFERENCE TO RELATED APPLICATIONS

This application claims benefit of U.S. Provisional patent application Ser. No. 60/471,609, filed May 19, 2003, which is incorporated herein by reference.

BACKGROUND OF THE DISCLOSURE

1. Field of the Invention

The invention relates to the fabrication of integrated circuits and to a process for depositing dielectric layers on a substrate and the structures formed by the dielectric layers.

2. Description of the Related Art

Semiconductor device geometries have dramatically decreased in size since such devices were first introduced several decades ago. Since then, integrated circuits have generally followed the "two year/half-size rule" (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to reduce the capacitive coupling between adjacent metal lines. One such low k material comprises silicon, oxygen, and carbon, and may be deposited as a dielectric material in fabricating damascene features. One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form vertical interconnects, i.e., vias, and horizontal interconnects, i.e., trenches or lines, of a feature definition. Conductive materials, such as copper and barrier layer materials used to prevent diffusion of copper into the surrounding low k dielectric are then inlaid into the etched pattern. Any excess copper and barrier layer materials external to the etched pattern, such as on the field of the substrate, are then removed.

However, forming damascene structures require the use of lithographic processes. For example, in process sequences using conventional lithographic techniques, a layer of energy sensitive resist is formed over a stack of material layers on a substrate. Many of these underlying material layers are reflective to ultraviolet light. Such reflections can distort the dimensions of features definitions, such as trenches and vias that are formed in the energy sensitive resist material. One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

However, conventional ARC materials as well as barrier materials and etch stops, may contain nitrogen, for example, silicon nitrides and metal nitrides may be used as ARC materials, barrier materials, and/or etch stops. The presence of nitrogen may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material or excessive photoresist residue remaining on the substrate surface after photoresist patterning, both of which can detrimentally affect subsequent processes, such as etching processes. For example, nitrogen may neutralize acid near a photoresist and ARC interface and result in residue formation, known as footing, which can further result in curved or rounded aspects at the interface of the bottoms and sidewalls of features rather than desired right angles.

Nitrogen may originate directly from deposited materials adjacent the resist layer and may also contaminate the resist material indirectly, such as by diffusion through one or more layers, outgassing of materials during processing steps, such as annealing and plasma treatment, and by etching processes which may expose underlying nitrogen containing layers, such as silicon nitride etch stops, to any subsequently deposited resist materials. Other materials that may also produce resist poisoning, including basic materials such as hydroxyl groups, may be exposed to the photoresist material by the same processes that can result in nitrogen exposure.

Therefore, there remains a need for an improved process and material for depositing and patterning dielectric materials with minimal resist poisoning for damascene applications.

SUMMARY OF THE INVENTION

Aspects of the invention generally provide a method for depositing a nitrogen-free dielectric layer for use as a hardmask or anti-reflective coating. In one aspect, the invention provides a method for processing a substrate including depositing a dielectric layer of a surface of the substrate, depositing an anti-reflective coating on a dielectric layer by reacting an oxygen-containing organosilicon compound and an acidic compound to deposit an acidic dielectric material on the substrate, depositing a photoresist material on the anti-reflective coating, and patterning the photoresist layer.

In another aspect of the invention, a method is provided for processing a substrate including depositing a barrier layer on a substrate surface, depositing at least one dielectric layer on a substrate surface, depositing a first photoresist material on the at least one dielectric layer, patterning the first photoresist layer to define a via for a feature definition, etching the at least one dielectric layer to define a via definition, depositing an acidic opaque material in the via definition by reacting an oxygen-containing organosilicon compound and an acidic compound, depositing a second photoresist material on the at least one dielectric layer and acidic opaque material, patterning the second photoresist layer to define a trench for the feature definition, etching the at least one dielectric layer and acidic opaque material to define a trench definition, and removing any remaining acidic opaque material and second photoresist material from the feature definition.

In another aspect of the invention, a method is provided for processing a substrate including depositing a barrier layer on a substrate surface, depositing at least one dielectric layer on a substrate surface, depositing a first photoresist material on the at least one dielectric layer, patterning the first photoresist layer to define a trench for a feature definition, etching the at least one dielectric layer to define a trench definition, depositing an acidic opaque material in the trench definition by reacting an oxygen-containing organosilicon compound and an acidic compound, depositing a second photoresist material on the at least one dielectric layer and acidic opaque material, patterning the first photoresist layer to define a via for the feature definition, etching the at least one dielectric layer and acidic opaque material to define a via definition, and removing any remaining acidic opaque material and second photoresist material from the feature definition.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
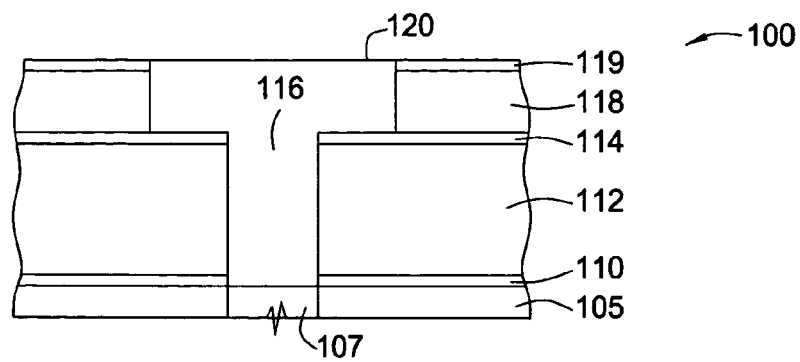
FIG. 1 is a cross sectional view showing a dual damascene structure comprising a low k barrier layer and a low k dielectric layer described herein.

For a further understanding of aspects of the invention, reference should be made to the ensuing detailed description.

DETAILED DESCRIPTION OF THE PREFERRED EMBODIMENTS

The words and phrases used herein should be given their ordinary and customary meaning in the art by one skilled in the art unless otherwise further defined. In situ should be broadly construed and includes, but is not limited to, in a given chamber, such as in a plasma chamber, or in a system, such as an integrated cluster tool arrangement, without exposing the material to intervening contamination environments, such as breaking vacuum between process steps or chamber within a tool. An in situ process typically minimizes process time and possible contaminants compared to relocating the substrate to other processing chambers or areas.

Aspects of the invention described herein refer to method for depositing an acidic dielectric material. The acidic dielectric material is a polymeric material that may be used as an anti-reflective coating and a sacrificial fill material for damascene formation.

The processes described herein are preferably performed in a processing chamber adapted to chemically mechanically deposit organosilicon material while applying RF power, such as DxZ™ chemical vapor deposition chamber or 300 mm Producer™ dual deposition station processing chamber, both of which are commercially available from Applied Materials, Inc., Santa Clara, Calif. An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention. In this experiment, the Producer™ deposition chamber is used.

In one aspect, the acidic dielectric material may be deposited by reacting an oxygen-containing organosilicon compound and an acidic compound. The acidic dielectric material comprises at least silicon, carbon, and oxygen. The acidic dielectric material may have a pH of less than about 7, for example, a pH of about 5 or less. The acidic dielectric material may have a dielectric constant of about 3.2 or less.

Suitable organosilicon compounds include oxygen-containing organosilicon compounds, such as siloxanes. For example, suitable oxygen-containing organosilicon compounds include tetraethoxysilane (TEOS), triethoxyfluorosilane (TEFS), dimethyldiethoxy (DMDE) silane, 1,3,5-trisilano-2,4,6-trimethylene. Additional suitable suitable oxygen-containing organosilicon compounds include, for example, one or more of the following compounds:

| | |
|---|---|
| Dimethyldimethoxysilane (DMDMOS), | $(CH_3)_2—Si—(OCH_3)_2$, |
| Diethoxymethylsilane (DEMS), | $(CH_3)—SiH—(OCH_3)_2$, |
| 1,3-dimethyldisiloxane, | $CH_3—SiH_2—O—SiH_2—CH_3$, |
| 1,1,3,3-tetramethyldisiloxane (TMDSO), | $(CH_3)_2—SiH—O—SiH—(CH_3)_2$, |
| Hexamethyldisiloxane (HMDS), | $(CH_3)_3—Si—O—Si—(CH_3)_3$, |
| Hexamethoxydisiloxane (HMDSO), | $(CH_3O)_3—Si—O—Si—(OCH_3)_3$, |
| 1,3-bis(silanomethylene)disiloxane, | $(SiH_3—CH_2—SiH_2—)_2—O$, |
| Bis(1-methyldisiloxanyl)methane, | $(CH_3—SiH_2—O—SiH_2—)_2—CH_2$, |
| 2,2-bis(1-methyldisiloxanyl)propane, | $(CH_3—SiH_2—O—SiH_2—)_2—C(CH_3)$ |

-continued

| | |
|---|---|
| 1,3,5,7-tetramethylcyclotetrasiloxane (TMCTS), | —(—SiHCH$_3$—O—)$_4$— (cyclic), |
| Octamethylcyclotetrasiloxane (OMCTS), | —(—Si(CH$_3$)$_2$—O—)$_4$— (cyclic), |
| 1,3,5,7,9-pentamethylcyclopentasiloxane, | —(—SiHCH$_3$—O—)$_5$— (cyclic), |
| 1,3,5,7-tetrasilano-2,6-dioxy-4,8-dimethylene, | —(—SiH$_2$—CH$_2$—SiH$_2$—O—)$_2$— (cyclic), |
| Hexamethylcyclotrisiloxane | —(—Si(CH$_3$)$_2$—O—)$_3$— (cyclic) | and fluorinated hydrocarbon derivatives thereof. The organosilicon compounds disclosed herein are provided as illustrative, and should not be construed or interpreted as limiting the scope or the invention.

Preferred organosilicon compounds are nitrogen-free oxygen containing organosilicon compounds including such compounds illustrated above, and provide a nitrogen-free source of oxygen, silicon, and carbon for the deposited acidic dielectric material. The organosilicon compounds are used to form a polymeric material, for example, a siloxane based polymeric material. The oxygen-containing organosilicon compound, such as octomethylcyclotetrasiloxane (OMCTS), may be supplied to the processing chamber at a flow rate of about 5 mgm or greater.

In an alternative embodiment of the organosilicon precursors, an oxygen-free organosilicon precursor may be used in the deposition process. Suitable free organosilicon precursors include, for example, methylsilanes, such as trimethylsilane and tetramethylsilanes, and phenylsilanes, such as dimethylphenylsilane and diphenylmethylsilane. Such precursors may be used to deposit silicon carbide based acidic dielectric layers.

Suitable acidic compounds include organic acids having one or more carboxylate groups. Examples of suitable organic acids having one or more carboxylate groups include citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, and combinations thereof. Additionally, any compound capable of neutralizing basic materials, such as amine groups, —NH$_2$, and hydroxyl groups, —OH, and capable of incorporation into the dielectric material may be used. For example, inorganic acids may be used as well as salts of organic and inorganic acids dissolved in suitable solution. The acidic compound, such as citric acid, may be supplied to the processing chamber at a flow rate of about 1 mgm or greater. Other vapor organic acids such as acetic acids can also be used with flow rate of 1 sccm or greater to form a deposited film with pH equal to or less than 5.

The organosilicon compounds and the acidic compound are generally supplied to the processing chamber in a flow rate ratio of the oxygen-containing organosilicon compound to acidic compound of between about 1000:1 (in sccm) and about 5:1 (in sccm) in case of vapor flow rate, such as flow rate ratio of the oxygen-containing organosilicon compound to acidic compound of between about 200:1 (in sccm) and about 5:1 (in sccm).

A carrier gas may be used to facilitate flow of the organosilicon compounds and acidic compounds, which may be in a liquid phase, into a processing chamber. Suitable carrier gases include inert gases, such as noble gases and nitrogen, for example, helium and argon. The inert gas may be provided at a flow rate between about 10 sccm and about 20,000 sccm.

An acidic dielectric material may be deposited in one embodiment by supplying the oxygen-containing organosilicon compound, such as octomethylcyclotetrasiloxane, to a processing chamber at a flow rate between about 100 sccm and about 2000 sccm, for example, between about 200 sccm and about 1000 sccm, supplying the acidic compound, such as citric acid, to the processing chamber at a flow rate between about 5 sccm and about 1000 sccm, for example between about 100 sccm and about 700 sccm, optionally supplying an inert gas, such as helium and/or argon, to the processing chamber at a flow rate between about 10 sccm and about 20,000 sccm, maintaining a substrate heater temperature between about 150° C. and about 550° C., such as between about 300° C. and about 450° C., and maintaining a chamber pressure below about 10 Torr, such as between about 1 Torr and about 5 Torr or between about 3 Torr and about 10 Torr, and spacing the substrate from the source of compounds at a distance between about 100 mils and about 1000 mils, such as between about 300 mils and about 500 mils.

The plasma may be generated power levels may be by applying a power density ranging between about 0.03 W/cm$^2$ and about 6.4 W/cm$^2$, which is a RF power level of between about 10 W and about 2000 W for a 200 mm substrate, for example, between about 50 W and about 400 W at a high frequency such as between 13 MHz and 14 MHz, for example, 13.56 MHz. The plasma may be generated power levels may be by applying a power density ranging between about 0.01 W/cm$^2$ and about 2.8 W/cm$^2$, which is a RF power level of between about 10 W and about 2000 W for a 300 mm substrate, for example, between about 100 W and about 400 W at a high frequency such as between 13 MHz and 14 MHz, for example, 13.56 MHz. The RF power can be provided continuously or in short duration cycles wherein the power is on at the stated levels for cycles less than about 200 Hz and the on cycles total between about 10% and about 30% of the total duty cycle. Alternatively, all plasma generation may be performed remotely, with the generated radicals introduced into the processing chamber for plasma treatment of a deposited material or deposition of a material layer.

Alternatively, the plasma may be generated by a dual-frequency RF power source. The power may be applied from a dual-frequency RF power source a first RF power with a frequency in a range of about 10 MHz and about 30 MHz at a power, for example, in a range of about 100 watts to about 1000 watts and at least a second RF power with a frequency in a range of between about 100 KHz and about 500 KHz as well as a power, for example, in a range of about 1 watt to about 200 watts.

The above process parameters provide a deposition rate for the acidic dielectric material in the range of about 500 Å/min to about 20,000 Å/min, such as such as a range between about 100 Å/min and about 3000 Å/min. The process conditions described here may vary between deposition of the acidic dielectric material based on the application. For example, the processing condition may be modified when deposition the acidic dielectric as an ARC layer with desired optical properties as compared to a bulk deposition of a sacrificial layer of acidic dielectric material.

In one preferred aspect, a acidic dielectric material may be deposited in one embodiment by supplying octomethylcyclotetrasiloxane to the processing chamber at a flow rate of about 200 sccm and about 1000 sccm, supplying citric acid to the processing chamber at a flow rate between about 100 sccm and about 700 sccm, maintaining a substrate heater temperature between about 250° C. and about 400° C., maintaining a chamber pressure between about 3 Torr and about 10 Torr, and spacing the substrate from the source of compounds at a distance between about 300 mils and about 500 mils. A plasma is generated at a RF (radio frequency) power level of between about 100 and about 200 watts for a 200 mm CVD chamber. The octomethylcyclotetrasiloxane and/or citric acid may be provided to the processing chamber in the presence of a helium carrier gas. The above process parameters provide a deposition rate for the acidic dielectric material in the range of about 200 Å/min to about 3000 Å/min, such as about 2000 Å/min, when implemented on a 200 mm (millimeter) substrate in a deposition chamber available from Applied Materials, Inc., Santa Clara, Calif.

The deposited may be exposed to a post-deposition treatment to increase the acidity of the deposited material. In one process, the deposited material is exposed to a hydrogen plasma. It is believed that the hydrogen plasma increases the deposited material acidity by reducing hydroxyl, —OH, bonding and increasing hydrogen, —H, termination bonds. The post-deposition treatment and the deposition process may be performed in situ.

The hydrogen plasma comprising introducing hydrogen gas into the processing chamber at a flow rate between about 1 sccm and about 10,000 sccm, and generating a plasma in the processing chamber. The hydrogen plasma may additionally include an inert gas including helium, argon, neon, xenon, krypton, or combinations thereof, of which helium is preferred. The plasma may be generated using a power density ranging between about 0.03 W/cm$^2$ and about 3.2 W/cm$^2$, which is a RF power level of between about 10 W and about 1000 W for a 200 mm substrate. Preferably, at a power level of about 100 watts for a silicon carbide material on a 200 mm substrate. The RF power can be a dual frequency power source also with a low frequency power source, such as between 100 kHz and 1 MHz, for example as 356 kHz as described herein for the deposition process herein. The RF power can be provided continuously or in short duration cycles wherein the power is on at the stated levels for cycles less than about 200 Hz and the on cycles total between about 10% and about 30% of the total duty cycle.

The processing chamber is preferably maintained at a chamber pressure of between about 3 Torr and about 12 Torr when generating the reducing plasma. A chamber pressure between about 5 Torr and about 10 Torr is preferably used. The substrate is maintained at a temperature between about 300° C. and about 450° C., preferably between about 350° C. and about 400° C. during the plasma treatment. The plasma treatment may be performed between about 10 seconds and about 100 seconds, with a plasma treatment between about 40 seconds and about 60 seconds preferably used. The processing gas may be introduced into the chamber by a gas distributor, the gas distributor may be positioned between about 200 mils and about 500 mils, preferably between about 300 mils and about 500 mils from the substrate surface.

In one aspect of the hydrogen plasma treatment process, the chamber processing conditions such as the pressure, temperature, exposure time, and spacing of the distributor head, may be the same as the deposition process. However, it should be noted that the respective parameters may be modified as necessary to treat the deposited materials described herein and to perform the plasma processes in various chambers and for different substrate sizes, such as 300 mm substrates. The plasma treatment may be performed in situ with layer or sacrificial material deposition.

Following deposition, the deposited acidic dielectric material may be annealed to reduce the moisture content and increase the solidity and hardness of the dielectric material, if desired. The deposited acidic dielectric material may be plasma treated or e-beam treated. A plasma treatment may be performed in the same chamber used to deposit the acidic dielectric material. The plasma treatment and e-beam treatment is believed to clean contaminants from the exposed surface of the acidic dielectric material and may be used to stabilize the layer, such that it becomes less reactive with moisture and/or oxygen under atmospheric condition as well as the adhesion of layers formed thereover. As mentioned above, low energy hydrogen plasma or e-beam treated surface in hydrogen ambient are the preferable method to increase the film's surface acidity.

The deposited acidic dielectric material may have a light absorption coefficient, or extinction coefficient ($\kappa$), that can be varied between about 0 to about 2.0, such as between about 0 and about 1.5, for example between about 0.1 and about 1.1, at wavelengths below about 250 nm (nanometers), such as about 248 nm wavelengths or 193 nm wavelengths, making it suitable for use as an anti-reflective coating (ARC) at deep ultraviolet (DUV) wavelengths. The $\kappa$ value represents the amount of absorption of light passing therethrough. As the $\kappa$ value increases, the amount of light absorption increases. A material having a $\kappa$ value of greater than about 0.5 has been observed to be effective for use as a hardmask and $\kappa$ values between about 0 and about 2 may be used for ARC applications depending upon the requirements for use of the ARC layer.

The acidic dielectric material also has an index of refraction (n), which represents the refraction of the light passing therethrough, of less than about 3 at wavelengths below about 250 nm, such as at 193 nm wavelength light. Generally, n values, such between about 1.5 and about 2.2, for example, between about 1.7 and about 2.2, are acceptable for lithographic processes at wavelengths below 250 nm (nanometers) using the hardmask and ARC layer applications described herein. The n values have been observed to generally increase with the $\kappa$ value up to about a $\kappa$ value of about 0.5. The n values are then observed to generally decrease as $\kappa$ values increase above 0.5.

The extinction coefficient ($\kappa$) and the index of refraction (n) of the acidic dielectric material may be varied as a function of the composition of the compounds and processing parameters.

The embodiments described herein for depositing acidic dielectric material are provided to illustrate the invention and particular embodiments, and should not be used to limit the scope of the invention.

Deposition of an ARC Layer for a Dual Damascene Structure

An example of a damascene structure that is formed using the acidic dielectric material described herein as an anti-reflective coating (ARC) is shown in FIG. 1. A damascene structure is formed using a substrate 100 having conductive material features 107, such as copper features, formed in a substrate material 105 is provided to a processing chamber. A barrier layer 110, such as silicon carbide containing material or the acidic dielectric material described herein, is deposited on the substrate material 105 and features 107.

A first dielectric layer 112, such as an interlayer dielectric material, such as a silicon oxycarbide material (carbon doped silicon oxide), is deposited on the barrier layer 110. An etch stop (or second barrier layer) 114 is then deposited on the first dielectric layer 112. The etch stop 114 may comprise a silicon carbide containing material or acidic dielectric material described herein. The etch stop is then pattern etched using conventional techniques to define the openings of the interconnects or contacts/vias. The etch stop 114 is then pattern etched to define the opening of the feature definition 116. A second dielectric layer 118 is then deposited over the patterned etch stop. An ARC layer 119 of an acidic dielectric material as described herein is then deposited over the second dielectric layer 118. A photoresist is then deposited and patterned by conventional means known in the art to define the feature definition 116. A single etch process is then performed to define the feature definition 116 down to the etch stop and to etch the unprotected dielectric exposed by the patterned etch stop to define the feature definition 116. One or more conductive materials 120 such as copper are then deposited and planarized to form the feature 100.

A preferred dual damascene structure fabricated in accordance with the invention including an acidic dielectric ARC layer deposited by the processes described herein is sequentially depicted schematically in FIGS. 2A–2H, which are cross sectional views of a substrate having the steps of the invention formed thereon.

Figure 2A:
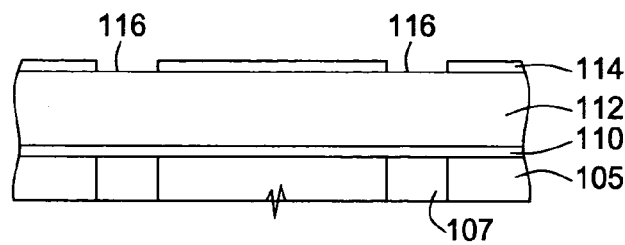
FIGS. 2A–2D are cross sectional views showing one embodiment of a dual damascene deposition sequence of the invention.

As shown in FIG. 2A, a silicon carbide based barrier layer 110 is deposited on the substrate surface. The silicon carbide based barrier layer 110 may be plasma treated or exposed to an e-beam treatment. The plasma treatment may be performed in situ with the deposition of the silicon carbide material. While not shown, a capping layer of nitrogen-free silicon carbide may be deposited on the barrier layer 110. The nitrogen-free silicon carbide capping layer may be deposited in situ. The silicon carbide based barrier layer 110 may comprise a nitrogen doped silicon carbide material, an oxygen containing silicon carbide layer, and/or a phenyl containing silicon carbide material. The barrier layer may further be doped with boron, phosphorus, or combinations thereof.

An example of a silicon carbide deposition process is described in co-pending U.S. patent application Ser. No. 09/165,248, filed on Oct. 1, 1998, entitled, "Silicon Carbide Deposition As A Barrier Layer And An Etch Stop", and in co-pending U.S. patent application Ser. No. 10/122,106, filed on Apr. 11, 2002, entitled, "Methods for Depositing Dielectric Materials", and in both of which are incorporated herein by reference to the extent not inconsistent with the claimed aspects and description herein. Oxygen-doped silicon carbide layers have oxygen concentrations of less than about 15 atomic % oxygen.

Example processes for depositing a nitrogen containing silicon carbide layer is disclosed in U.S. patent application Ser. No. 09/627,667, filed on Jul. 28, 2000, Feb. 23, 2001, and U.S. Pat. Ser. No. 6,537,733, issued on Mar. 25, 2003, which are incorporated by reference to the extent not inconsistent with the claims and disclosure described herein.

An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein.

Example processes for depositing a phenyl containing silicon carbide layer is disclosed in U.S. patent application Ser. No. 10/010,950, filed on Nov. 13, 2001, and U.S. patent application Ser. No. 10/342,079, filed on Jan. 13, 2002, which are incorporated by reference to the extent not inconsistent with the claims and disclosure described herein.

A first dielectric layer 112 of interlayer dielectric material, such as a silicon oxycarbide, is deposited on the first oxygen-doped silicon carbide barrier layer 110 to a thickness of about 5,000 to about 15,000 Å, depending on the size of the structure to be fabricated. An example of a low dielectric constant material that may be used as an interlayer dielectric material is Black Diamond™ dielectric material commercially available from Applied Materials, Inc., of Santa Clara, Calif. An example of the dielectric material for the first dielectric layer 112 and process for deposition the dielectric material is more fully described in U.S. Pat. No. 6,287,990, issued on Sep. 11, 2001, which is incorporated by reference herein to the extent not inconsistent with the description and claims herein. The first dielectric layer my also comprise other low k dielectric materials including a low polymer material, such as parylene, or a low k spin-on glass such as un-doped silicon glass (USG) or fluorine-doped silicon glass (FSG). The first dielectric layer 112 may then be treated by a plasma process or e-beam technique to remove contaminants and densify the surface of the dielectric layer 122.

As shown in FIG. 2A, the low k etch stop 114, which may be a silicon carbide material or acidic dielectric material as described herein may then be deposited on the first dielectric layer to a thickness of about 200 to about 1000 Å. The low k etch stop 114 may be plasma treated as described herein for the silicon carbide barrier layer 110. The low k etch stop 114 is then pattern etched to define the feature definition openings 116 and to expose first dielectric layer 112 in the areas where the feature definitions are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2B:
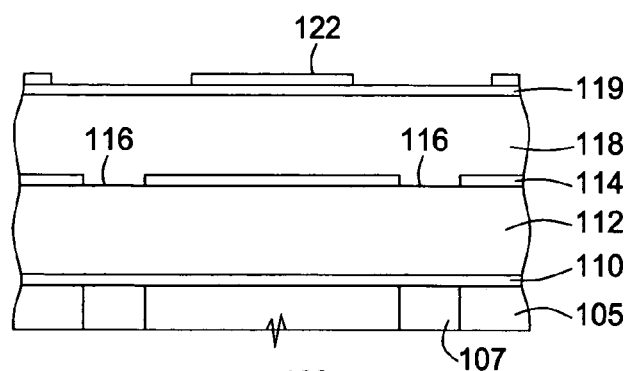
Figure 2C:
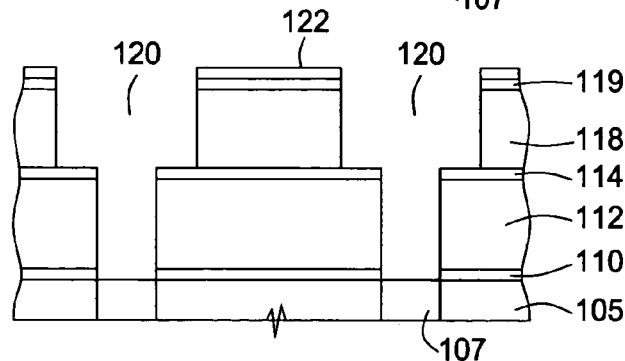

After low k etch stop 114 has been etched to pattern the feature definition openings and the photoresist has been removed, a second dielectric layer 118 of silicon oxycarbide is deposited to a thickness of about 5,000 to about 15,000 Å and a ARC layer 119 of the acidic dielectric material deposited thereon as shown in FIG. 2B. The second dielectric layer 118 may be plasma treated or e-beam treated as described herein for the first dielectric layer 112 prior to depositing the acidic dielectric ARC layer 119. The plasma treatment and e-beam treatment is believed to reduce the reactivity of the surface of the layer 118 to subsequently deposited materials.

The acidic dielectric ARC layer 119 may be deposited as described herein on the second dielectric layer 118. For example, the ARC layer 110 may be deposited by supplying the oxygen-containing organosilicon compound, such as octomethylcyclotetrasiloxane, to a processing chamber at a flow rate between about 100 sccm and about 1000 sccm, supplying the acidic compound, such as citric acid in He carrier gas, to the processing chamber at a flow rate between about 5 sccm and about 100 sccm, maintaining a substrate heater temperature between about 150° C. and about 400° C., and maintaining a chamber pressure below about 10 Torr, such as between about 1 Torr and about 5 Torr, and spacing the substrate from the source of compounds at a distance between about 100 mils and about 1000 mils. A plasma is generated by applying a RF power between about 50 watts and about 300 watts, at a RF frequency of about 13.6 MHz, for a 200 mm diameter CVD chamber. The octomethylcyclotetrasiloxane and/or acidic compound may be provided to the processing chamber in the presence of a helium carrier gas.

In an alternative embodiment, a nitrogen-free silicon carbide or silicon oxide cap layer between about 100 Å and about 500 Å thick may be deposited on second dielectric layer 118 prior to depositing additional materials, such as the ARC layer 119.

A photoresist material 122 is then deposited on the acidic dielectric ARC layer 119 and patterned preferably using conventional photolithography processes to define the interconnect lines 120 as shown in FIG. 2B. The photoresist material 122 comprises a material conventionally known in the art, preferably a high activation energy photoresist, such as UV-5, commercially available from Shipley Company Inc., of Marlborough, Mass. The dielectric layers are then etched using reactive ion etching or other anisotropic etching techniques to define the feature definition as shown in FIG. 2C. Any photoresist or other material used to pattern the etch stop 114 or the second dielectric layer 118 is removed using an oxygen strip or other suitable process.

Figure 2D:
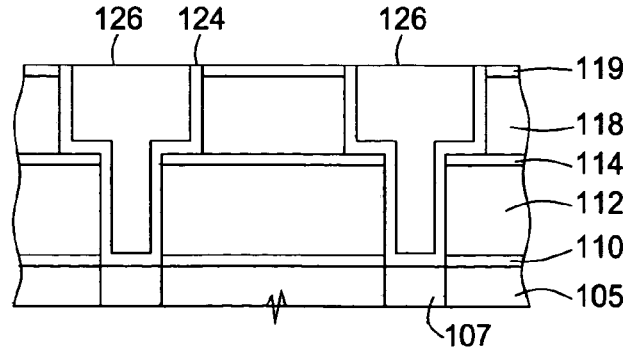

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2D, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2D.

Deposition of a Dual Damascene Structure with Sacrificial Dielectric Material

In an alternative embodiment of the damascene structure, the acidic dielectric material described herein may be deposited as a sacrificial dielectric material during processing for reducing photoresist poisoning in damascene formation. Examples of damascene structures that are formed using an acidic dielectric material as a sacrificial material is shown in FIGS. 3A–3E and 4A–4E, which are cross sectional views of a substrate having the steps of the invention formed thereon.

Figure 3A:
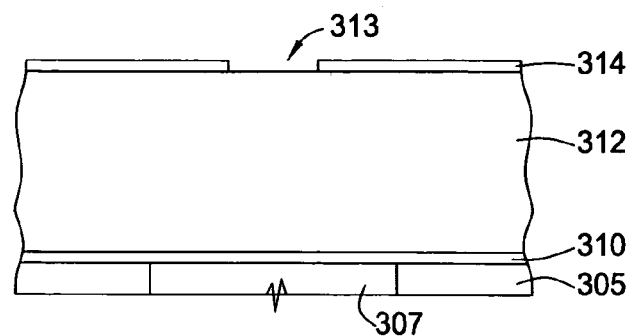
FIGS. 3A–3E are cross sectional views showing one embodiment of a dual damascene deposition sequence of the invention.

As shown in FIG. 3A, a barrier layer 310, preferably a low k dielectric material, such as the silicon carbide materials described herein, is deposited on the substrate surface to eliminate inter-level diffusion between the substrate and subsequently deposited material. The substrate surface may comprise metal features 307, such as copper interconnects, formed in a dielectric material 305. The barrier layer 310 may be doped with oxygen, boron, phosphorus, or combinations thereof.

A dielectric layer 312, which may comprise one or more dielectric materials, preferably low dielectric materials, such as silicon oxycarbide material and other materials as described herein, is deposited on the barrier layer 310 on the substrate surface to a thickness of about 5,000 to about 15,000 Å, depending on the size of the structure to be fabricated. A plasma process following deposition as described herein for the silicon oxycarbide layer may then treat the dielectric layer 312. While not shown the dielectric layer 312 may comprise a first dielectric layer, a low k etch stop, and a second dielectric layer as described herein and as shown in FIGS. 2A–2D.

Figure 3B:
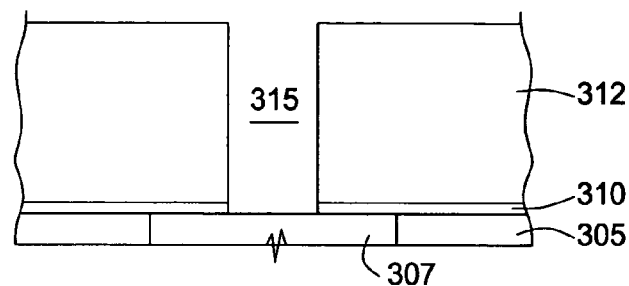

A first resist material 314, for example, ZEP™ manufactured by Hoya Corporation or RISTON™ manufactured by DuPont de Nemours Chemical Company, is then deposited on the first dielectric layer 312 to a thickness between about 300 Å and about 20000 Å. The resist material 314 is then pattern etched to define via openings 313 and to expose dielectric layer 312 in the areas where the vias are to be formed as shown in FIG. 3A. Preferably, the resist material 314 is pattern etched using conventional photolithography. Then the underlying dielectric layer 312 is etched using conventional processes, such as etch processes using fluorine, carbon, and oxygen ions, to define the via definition 315 and expose the metal feature 307 or barrier layer 310 as shown in FIG. 3B. While not shown, a nitrogen-free silicon carbide or silicon oxide cap layer between about 50 Å and about 500 Å thick may be deposited on the dielectric layer 314 prior to depositing the resist material 314.

Figure 3C:
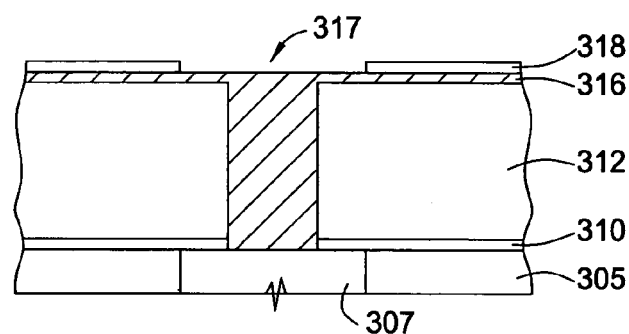

After the dielectric layer 312 has been etched to pattern the via definition 315 and the photoresist has been removed, a sacrificial dielectric material 316 is deposited to fill at least a portion of the via definition as shown in FIG. 3C. The sacrificial dielectric layer of the acid dielectric material described herein may be deposited by the processes described herein. One example of the a process comprises supplying the oxygen-containing organosilicon compound, such as octomethylcyclotetrasiloxane, to a processing chamber at a flow rate between about 100 sccm and about 1000 sccm, supplying the acidic compound, such as citric acid, to the processing chamber at a flow rate between about 5 sccm and about 100 sccm, maintaining a substrate heater temperature between about 150° C. and about 400° C., and maintaining a chamber pressure below about 10 Torr, such as between about 1 Torr and about 5 Torr, spacing the substrate from the source of compounds at a distance between about 100 mils and about 1000 mils, and generating a plasma by applying a RF power between about 50 watts and about 300 watts at about 13.6 MHz, for a 200 mm diameter CVD chamber. The octomethylcyclotetrasiloxane and/or acidic compound may be provided to the processing chamber in the presence of a helium carrier gas.

The sacrificial layer may be deposited to fill the entire feature definition 319 as shown in FIG. 3C, or only a portion of the feature definition 319. A second resist material 318 is then deposited on the sacrificial dielectric layer 316 and any exposed dielectric material 312 to a thickness between about 300 Å and about 20000 Å. The second resist material 318 is then pattern etched to define trench openings 317 and to expose dielectric layer 312 in the areas where the trenches are to be formed as shown in FIG. 3C.

Figure 3D:
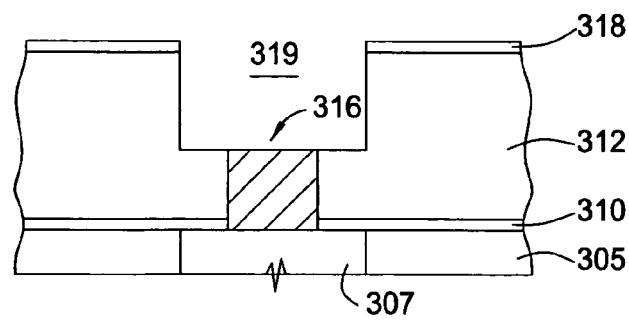

The trench feature definition 319 is then etched through to the sacrificial dielectric material 316 and the first dielectric layer 312 as shown in FIG. 3D. Alternatively, if an etch stop layer is used, the etching process will be performed to the etch step and through as necessary to form the desired feature definition 319. Any remaining second photoresist 318 and sacrificial dielectric material 316 is then removed by etching using either liquid etching solution, such as a buffered hydrofluoric acid solution, or a plasma of fluorocarbon and oxygen. The sacrificial dielectric material 316 as described herein has exhibited an etching selectivity of dielectric material 312 to acidic dielectric material 316 of about 1:1.

Figure 3E:
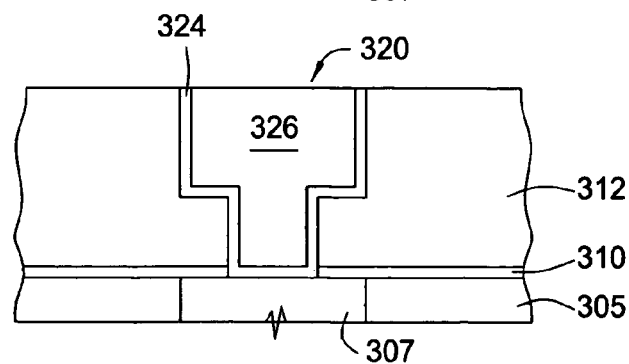

The interconnect lines is then formed by filling the feature definition 320 one or more conductive materials such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, a suitable barrier layer 324 such as tantalum or tantalum nitride is first deposited conformally in the metallization pattern to prevent copper migration into the surrounding silicon and/or dielectric material. Thereafter, copper 326 is deposited using electrochemical deposition, such as electroplating or electroless deposition, chemical vapor deposition, physical vapor deposition, or combinations thereof, to fill the structure. Once the structure has been filled with copper or other metal, the surface is planarized using chemical mechanical polishing as shown in FIG. 3E.

In an alternative embodiment of the damascene structure formation using an acidic dielectric material described herein as a sacrificial dielectric materials, a feature definition is formed by first forming a trench definition and then using the sacrificial dielectric material to form the via definition is shown in FIGS. 4A–4E.

Figure 4A:
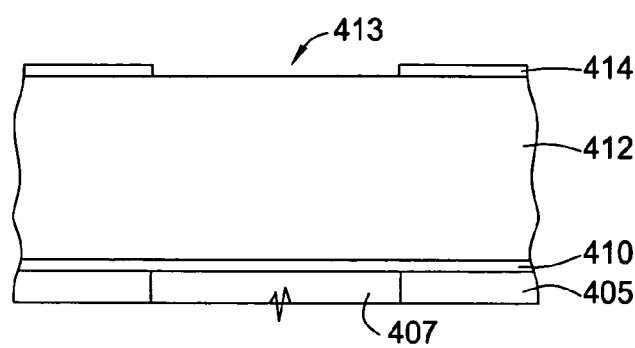
FIGS. 4A–4E are cross sectional views showing one embodiment of a dual damascene deposition sequence of the invention.

As shown in FIG. 4A, a barrier layer 410, preferably a low k dielectric material, such as a silicon carbide material as described herein, is deposited on the substrate surface to eliminate inter-level diffusion between the substrate and subsequently deposited material. The substrate surface may comprise metal features 407, such as copper interconnects, formed in a dielectric material 405. The barrier layer 410 may be doped with oxygen, boron, phosphorus, or combinations thereof.

A dielectric layer 412, which may comprise one or more dielectric materials, preferably low dielectric materials, such as silicon oxycarbide material and other materials as described herein, is deposited on the barrier layer 410 on the substrate surface to a thickness of about 5,000 to about 15,000 Å, depending on the size of the structure to be fabricated. A plasma process or exposure to an e-beam technique may follow deposition as described herein for the silicon oxycarbide layer may then be used on the dielectric layer 412. While not shown the dielectric layer 412 may comprise a first dielectric layer, a low k etch stop, and a second dielectric layer as described herein and as shown in FIGS. 2A–2D.

Figure 4B:
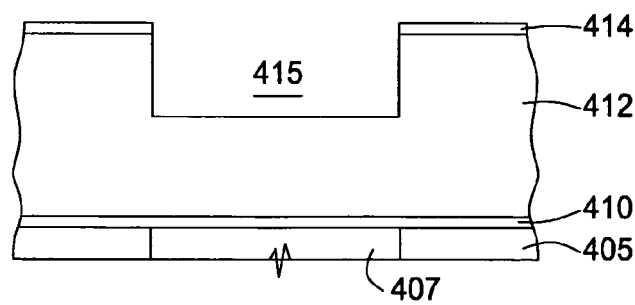

A first resist material 414, for example, ZEP™ manufactured by Hoya Corporation or RISTON™ manufactured by DuPont de Nemours Chemical Company, is then deposited on the first dielectric layer 412 to a thickness between about 300 Å and about 20000 Å. The resist material 414 is then pattern etched to define a trench openings 413 and to expose dielectric layer 412 in the areas where the vias are to be formed as shown in FIG. 4A. Preferably, the resist material 414 is pattern etched using conventional photolithography. Then the underlying dielectric layer 412 is etched using conventional processes, such as etch processes using fluorine, carbon, and oxygen ions, to form trench definition 415 and expose the metal feature 407 or barrier layer 410 as shown in FIG. 4B. Alternatively, if an etch stop layer is used, the etching process will be performed to the etch step and through as necessary to form the desired feature definition 415. While not shown, a nitrogen-free silicon carbide or silicon oxide cap layer between about 50 Å and about 500 Å thick may be deposited on the dielectric layer 414 prior to depositing the resist material 414.

Figure 4C:
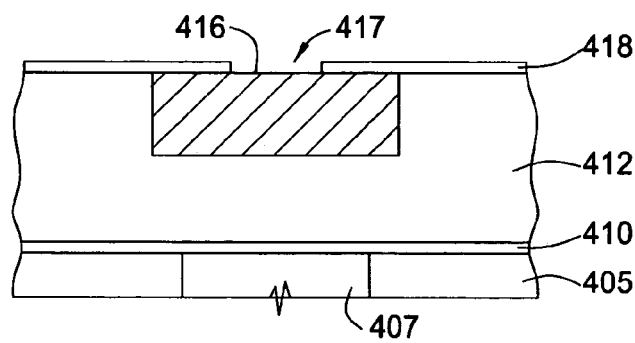

After the dielectric layer 412 has been etched to pattern the define the trench definition 415 and the photoresist has been removed, a sacrificial dielectric material 416 is deposited to fill at least a portion of the via definition as shown in FIG. 4C. The sacrificial dielectric layer of the acid dielectric material described herein may be deposited, for example, by a process comprising supplying a oxygen-containing organosilicon compound, such as octomethylcyclotetrasiloxane, to a processing chamber at a flow rate between about 100 sccm and about 1000 sccm, supplying the acidic compound, such as citric acid, to the processing chamber at a flow rate between about 5 sccm and about 100 sccm, maintaining a substrate heater temperature between about 150° C. and about 400° C., and maintaining a chamber pressure below about 10 Torr, such as between about 1 Torr and about 5 Torr, spacing the substrate from the source of compounds at a distance between about 100 mils and about 1000 mils, and generating a plasma by applying a RF power between about 50 watts and about 300 watts at about 13.6 MHz, for a 200 mm diameter CVD chamber. The octomethylcyclotetrasiloxane and/or acidic compound may be provided to the processing chamber in the presence of a helium carrier gas.

A second resist material 418 is then deposited on the sacrificial dielectric layer 316 and any exposed dielectric material 412 to a thickness between about 300 Å and about 20000 Å. The second resist material 418 is then pattern etched to define via openings 417 as shown in FIG. 4C. The sacrificial dielectric material 416 of the described herein has exhibited an etching selectivity of dielectric to acidic material of about 1:1.

Figure 4D:
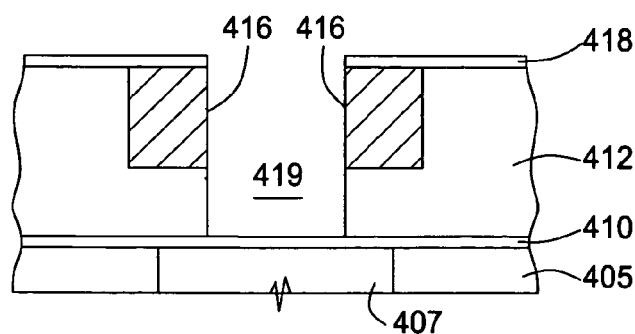

The via definition 419 is then etched through the sacrificial dielectric material 416 and the first dielectric layer 412 as shown in FIG. 4D. Any remaining second photoresist 418 and sacrificial dielectric material 416 is then removed by oxygen or hydrogen plasma ashing.

Figure 4E:
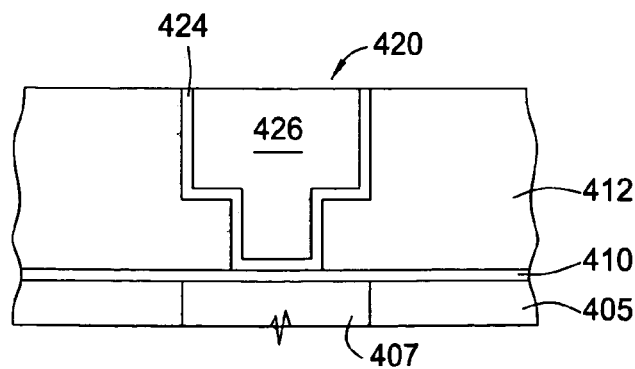

The interconnect lines is then formed by filling the feature definition 420 one or more conductive materials such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, a suitable barrier layer 424 such as tantalum or tantalum nitride is first deposited conformally in the metallization pattern to prevent copper migration into the surrounding silicon and/or dielectric material. Thereafter, copper 426 is deposited using electrochemical deposition, such as electroplating or electroless deposition, chemical vapor deposition, physical vapor deposition, or combinations thereof, to fill the structure. Once the structure has been filled with copper or other metal, the surface is planarized using chemical mechanical polishing as shown in FIG. 4E.

In an alternative embodiment, a photoresist material may be deposited for the first sacrificial layer 416. In this approach it is believed that the any contamination or poisoning of the photoresist layer would not effect the already form via feature definition 413 nor the etch rate of the process for forming the trench definition 419. Additionally, it is believed that the resist material 416 would be readily removed by process used to remove the photoresist material 418. The resist material 416 would preferably fill the via features definition 415 and would not overfill the feature definition 413 as in the case shown in FIG. 3C. The photoresist material 416 may have similar etching rates to the dielectric layer 412 for effective etching of the trench via definition 419. One example of a suitable resist material is ESCAP™ resist material, which is commercially available.

Deposition of a Dual Damascene Structure with a Partial Fill of Sacrificial Dielectric Material In an alternative embodiment of the damascene structure, the acidic dielectric material described herein may be deposited as a partial fill of sacrificial dielectric material during a dual damascene layering scheme to reduce photoresist poisoning. Examples of damascene structures that are formed using an acidic dielectric material as a partial fill of a sacrificial material is shown in FIGS. 5A–5D, which are cross sectional views of a substrate having the steps of the invention formed thereon.

Figure 5A:
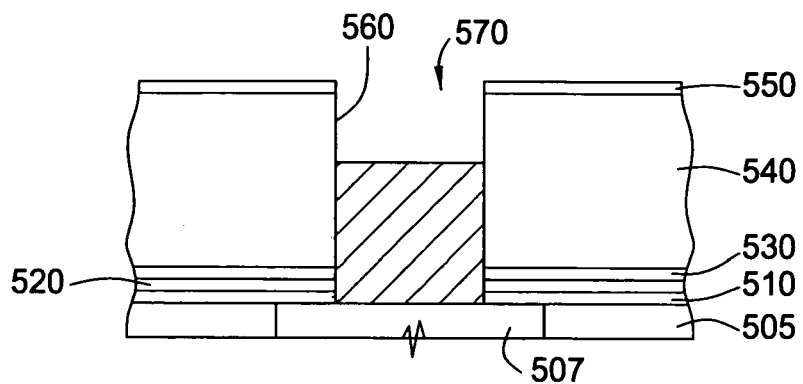
FIGS. 5A–5D are cross sectional views showing one embodiment of a dual damascene deposition sequence of the invention.

As shown in FIG. 5A, a barrier stack of layers 510, 520, and optionally, 530, is deposited on the substrate surface to eliminate inter-level diffusion between the substrate and subsequently deposited material. The substrate surface may comprise metal features 507, such as copper interconnects, formed in a dielectric material 505. The first barrier layer 510 may comprise a nitrogen containing compound. An example of a suitable first barrier layer nitrogen-dope silicon carbide and is more fully described in U.S. Pat. No. 6,537,733, issued on Mar. 25, 2003, and incorporated herein to the extent not inconsistent with the claimed aspects and disclosure herein. The first barrier layer 510 may be deposited to any thickness, and is deposited to 100 Å for the structure shown in FIG. 5A.

The second barrier layer 520 may comprise a nitrogen-free dielectric compound. An example of a suitable second barrier layer is a silicon carbide layer as described herein above. The second barrier layer 520 may be deposited to any thickness, and is deposited to 600 Å for the structure shown in FIG. 5A. The third barrier layer 530 may comprise a nitrogen-free capping material. An example of a suitable third barrier layer is a silicon oxide cap layer as described herein above. The second barrier layer 520 may be deposited to any thickness, and is deposited to 300 Å for the structure shown in FIG. 5A. Alternatively, the barrier stack may comprise single barrier layer of a low k dielectric barrier material, such as a silicon carbide material as described herein, which may be doped with oxygen, boron, phosphorus, or combinations thereof.

A dielectric layer 540, which may comprise one or more dielectric materials, preferably low dielectric materials, such as silicon oxycarbide material and other materials as described herein, is deposited on the third barrier layer 530 on the substrate surface to a thickness of about 5,000 Å to about 15,000 Å, for example, about 6,000 Å, depending on the size of the structure to be fabricated. A post-deposition plasma process as described herein for the silicon oxycarbide layer may then be performed on the dielectric layer 540. While not shown the dielectric layer 540 may comprise a first dielectric layer, a low k etch stop, and a second dielectric layer as described herein and as shown in FIGS. 2A–2D.

A dielectric anti-reflective coating (DARC) layer 550 may be deposited on the dielectric layer 540 for a subsequent photolithographic process. The DARC layer may comprise a nitrogen free silicon oxycarbide ARC material. An example of such an ARC material is a nitrogen free silicon oxycarbide material deposited by a plasma enhanced chemical vapor deposition of silane and tetraethoxysilane in the presence of an inert gas. A more complete description of a nitrogen free silicon oxycarbide material and deposition process is in U.S. patent application Ser. No. 10/193,489, entitled, "Nitrogen-Free Dielectric Anti-Reflective Coating And Hardmask", and filed on Jul. 11, 2002, and incorporated herein to the extent not inconsistent with the claimed aspects and disclosure herein. The DARC layer 550 may be deposited to any thickness, and is deposited to 800 Å for the structure shown in FIG. 5A.

Figure 5B:
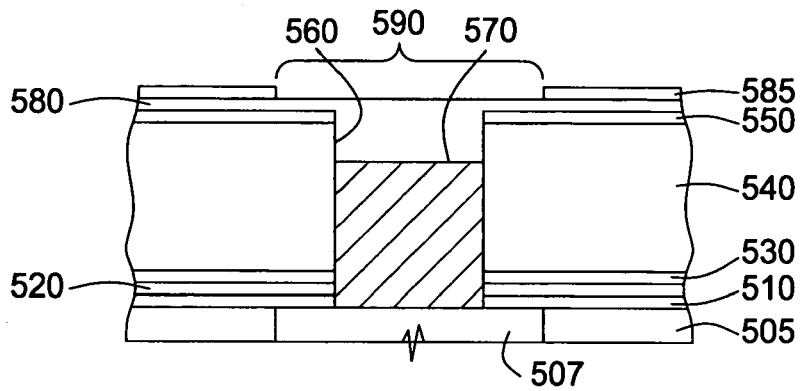

The dielectric stack may then be etched to form a via definition 560 as previously described herein by using a photolithographic process. After the dielectric stack of layer 510, 520, 530, 540, and 550 have been etched to pattern the via definition 560, a sacrificial dielectric material 570 is deposited to fill at least a portion of the via definition as shown in FIG. 5A. The sacrificial dielectric layer 570 of the acid dielectric material described herein may be deposited by the processes described herein. The sacrificial dielectric layer 570 may be deposited to fill only a portion of the feature definition 560. A resist material 580 or DARC material may then deposited on the sacrificial dielectric layer 570 and any exposed dielectric material 540 to a thickness between about 300 Å and about 20,000 Å to fill the feature definition 560. The resist material 570, if a DARC layer is used, or a second resist material 585, if a resist material 580 is used, is then pattern etched to define trench openings 590 and to expose dielectric layer 540 in the areas where the trenches are to be formed as shown in FIG. 5B.

Figure 5C:
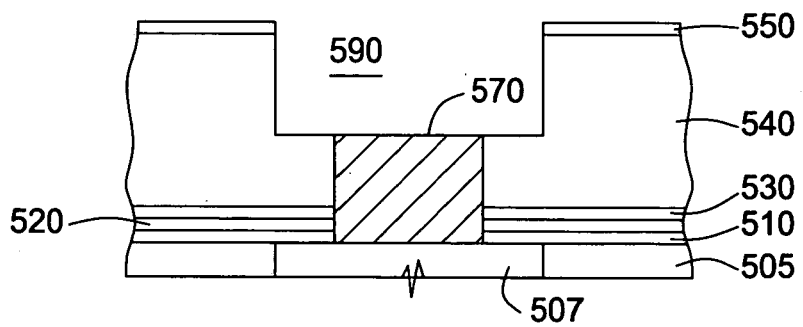

The trench feature definition 590 is then etched through to the sacrificial dielectric material 570, the DARC layer 550 and the first dielectric layer 540 as shown in FIG. 5C. Alternatively, if an etch stop layer is used, the etching process will be performed to the etch step and through as necessary to form the desired feature definition 590. Any remaining photoresist and sacrificial dielectric material is then removed by etching using either liquid etching solution, such as a buffered hydrofluoric acid solution, or a plasma of fluorocarbon and oxygen. The sacrificial dielectric material 570 as described herein has exhibited an etching selectivity of dielectric layer 540 to acidic dielectric material 570 of about 1:1.

Figure 5D:
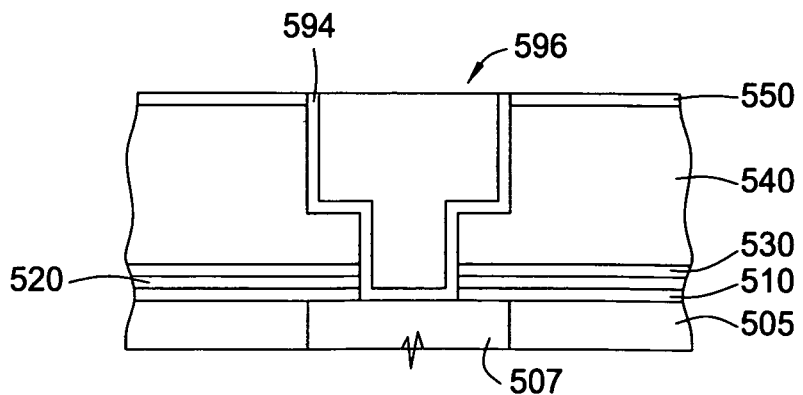

The interconnect lines is then formed by filling the feature definition 520 one or more conductive materials such as aluminum, copper, tungsten or combinations thereof. Presently, the trend is to use copper to form the smaller features due to the low resistivity of copper (1.7 µΩ-cm compared to 3.1 µΩ-cm for aluminum). Preferably, a suitable barrier layer 594 such as tantalum or tantalum nitride is first deposited conformally in the metallization pattern to prevent copper migration into the surrounding silicon and/or dielectric material. Thereafter, copper 596 is deposited using electrochemical deposition, such as electroplating or electroless deposition, chemical vapor deposition, physical vapor deposition, or combinations thereof, to fill the structure. Once the structure has been filled with copper or other metal, the surface is planarized using chemical mechanical polishing as shown in FIG. 5D.

Deposition of a Dual Damascene Structure with Dual Sacrificial Dielectric Material Layers In an alternative embodiment of the damascene structure, the acidic dielectric material described herein may be deposited as a partial fill of sacrificial dielectric material during a dual damascene layering scheme to reduce photoresist poisoning. Examples of damascene structures that are formed using acidic dielectric materials described herein as a fill layer and seal layer of sacrificial material is shown in FIGS. 6A–6C, which are cross sectional views of a substrate having the steps of the invention formed thereon.

Figure 6A:
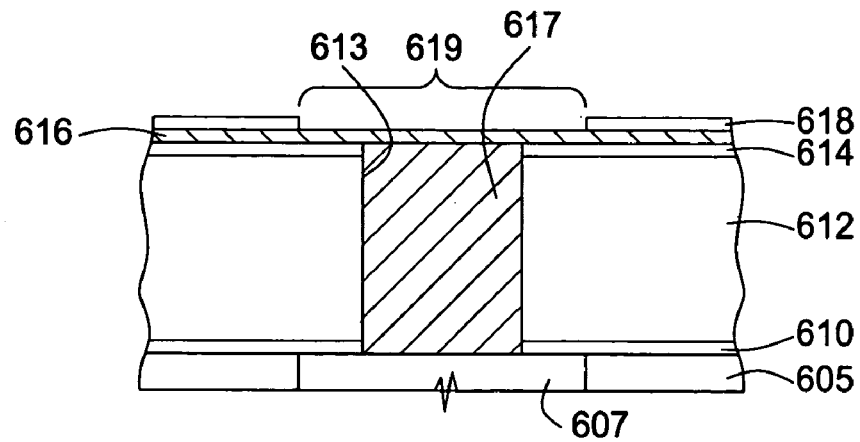
FIGS. 6A–6C are cross sectional views showing one embodiment of a dual damascene deposition sequence of the invention.
Figure 6B:
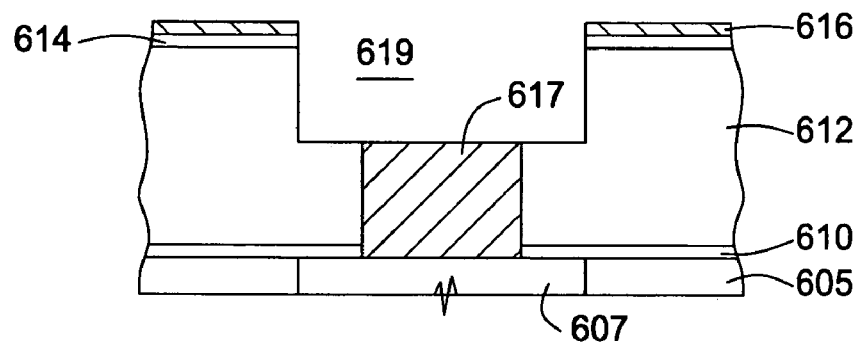
Figure 6C:
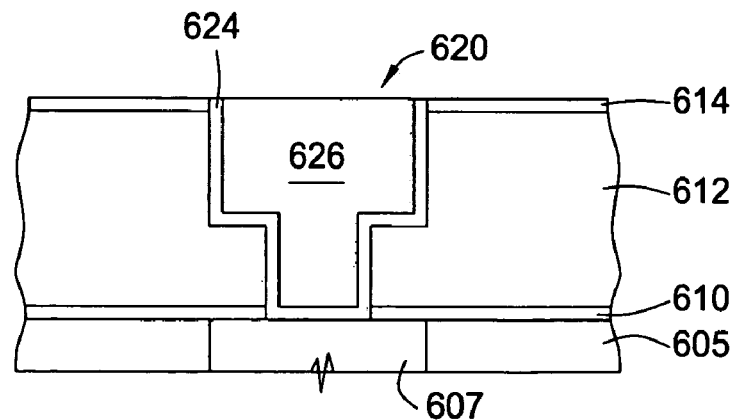

As shown in FIG. 6A, a barrier layer 610, preferably a low k dielectric material, such as the silicon carbide materials described herein, is deposited on the substrate surface to eliminate inter-level diffusion between the substrate and subsequently deposited material. The substrate surface may comprise metal features 607, such as copper interconnects, formed in a dielectric material 605. The barrier layer 610 may be doped with oxygen, boron, phosphorus, or combinations thereof.

A dielectric layer 612, which may comprise one or more dielectric materials, preferably low dielectric materials, such as silicon oxycarbide material and other materials as described herein, is deposited on the barrier layer 610 on the substrate surface to a thickness of about 5,000 to about 15,000 Å, depending on the size of the structure to be fabricated. A plasma process following deposition as described herein for the silicon oxycarbide layer may then treat the dielectric layer 612. A dielectric anti-reflective coating (DARC) layer 614 as described herein previously may be deposited on the dielectric layer 612 for a subsequent photolithographic process.

The dielectric stack may then be etched to form a via definition 613 as previously described herein by using a photolithographic process of a photoresist material. After the dielectric stack of layer 610, 612, and 614 have been etched to pattern the via definition 613 and photoresist materials have been removed, a first sacrificial dielectric material 617 as described herein previously is then deposited to fill the via definition 613. The first sacrificial material 617 may be deposited to overfill the entire feature definition 613 and then etched back or polished back by a suitable process to form a substantially planar surface with the DARC layer 614 as shown in FIG. 6A.

A second sacrificial material 616 as described herein may be deposited over the first sacrificial material 617 and DARC layer 614. The second sacrificial material 616 may be used as a seal layer to protect subsequently deposited photoresist material 618 from poisoning. The second sacrificial material 616 may also performed as an anti-reflective coating for any subsequent lithographic process. The first and second sacrificial materials 616 and 617 may be the same material or may be different materials as desired. A resist material 618 is then deposited on the second sacrificial dielectric layer 616 to a thickness between about 300 Å and about 20000 Å. The second resist material 618 is then pattern etched to define trench openings 619 and to expose the second sacrificial dielectric layer 616 in the areas where the trenches are to be formed as shown in FIG. 6A.

The trench feature definition 619 is then etched through to the second sacrificial material 616, The DARC layer 614, the first sacrificial material 617, and the first dielectric layer 612 as shown in FIG. 6B. Any remaining second photoresist 618 and sacrificial dielectric material 616, 617, is then removed by etching using either liquid etching solution, such as a buffered hydrofluoric acid solution, or a plasma of fluorocarbon and oxygen. The sacrificial dielectric material 616, 617, as described herein has exhibited an etching selectivity of dielectric to acidic material of about 1:1. The first and second sacrificial dielectric material may have different etching rates, but preferably have the same etching rates.

In an alternative embodiment, a sacrificial photoresist material may be deposited for the first sacrificial material 617. In this approach it is believed that the any contamination or poisoning of the photoresist layer would not effect the already form via feature definition 613 nor the etch rate of the process for forming the trench definition 619. Additionally, it is believed that the sacrificial resist material would be readily removed by process used to remove the photoresist material 618. The sacrificial photoresist material may have similar etching rates to the second sacrificial material layer 616 for effective etching of the trench via definition 619. One example of a suitable resist material is ESCAP™ resist material, which is commercially available.

The interconnect lines is then formed by filling the feature definition 620 with one or more conductive materials such as aluminum, copper, tungsten or combinations thereof. Presently, the trend is to use copper to form the smaller features due to the low resistivity of copper (1.7 μΩ-cm compared to 3.1 μΩ-cm for aluminum). Preferably, a suitable barrier layer 624 such as tantalum or tantalum nitride is first deposited conformally in the metallization pattern to prevent copper migration into the surrounding silicon and/or dielectric material. Thereafter, copper 626 is deposited using electrochemical deposition, such as electroplating or electroless deposition, chemical vapor deposition, physical vapor deposition, or combinations thereof, to fill the structure. Once the structure has been filled with copper or other metal, the surface is planarized using chemical mechanical polishing as shown in FIG. 6C.

EXAMPLES

The following examples illustrate deposition of the materials described herein for ARC and sacrificial fill applications. The materials were deposited using a chemical vapor deposition chamber that is part of an integrated processing platform. In particular, the films were deposited using a Producers™ deposition system commercially available from Applied Materials, Inc. of Santa Clara, Calif.

An acidic dielectric ARC layer was deposited by a mixed precursor process on a 200 mm substrate from the following reactive compounds of octomethylcyclotetrasiloxane and citric acid, which both precursors may be used with a helium carrier gas, to a processing chamber at a flow rate between about 100 sccm and about 1000 sccm for octomethylcyclotetrasiloxane, and between about 5 sccm and about 100 sccm for the citric acid, maintaining a substrate heater temperature between about 150° C. and about 400° C., and maintaining a chamber pressure below about 10 Torr, such as between about 1 Torr and about 5 Torr, and spacing the substrate from the source of compounds at a distance between about 100 mils and about 1000 mils from the distribution showerhead, and generating a plasma at a RF power level of between about 50 and about 300 watts for a 200 mm diameter CVD chamber.

An acidic dielectric sacrificial material was deposited by a mixed precursor process on a 200 mm substrate from the following reactive compounds of octomethylcyclotetrasiloxane and citric acid, which both precursors may be used with a helium carrier gas, to a processing chamber at a flow rate between about 100 sccm and about 1000 sccm for octomethylcyclotetrasiloxane, and between about 5 sccm and about 100 sccm for the citric acid, maintaining a substrate heater temperature between about 150° C. and about 400° C., and maintaining a chamber pressure below about 10 Torr, such as between about 1 Torr and about 5 Torr, and spacing the substrate from the source of compounds at a distance between about 100 mils and about 1000 mils from the distribution showerhead, and generating a plasma at a RF power level of between about 50 and about 300 watts for a 200 mm diameter CVD chamber. The material was deposited at a rate of about 3000 Å/min for about 10 to 180 seconds for a deposition thickness of between about 300 Å and about 9000 Å.

While the foregoing is directed to preferred embodiments of the present invention, other and further embodiments of the invention may be devised without departing from the basic scope thereof, and the scope thereof is determined by the claims which follow.

What is claimed is:

1. A method of processing a substrate, comprising:
depositing a dielectric layer on a surface of the substrate;
depositing an acidic anti-reflective coating on the dielectric layer by:
generating a plasma; and
reacting an oxygen-containing organosilicon compound and an acidic compound in the plasma;
depositing a photoresist material on the acidic anti-reflective coating; and
patterning the photoresist layer.

2. The method of claim 1, further comprising:
etching the anti-reflective coating and any underlying dielectric material to define an interconnect opening therethrough; and
depositing one or more conductive materials to fill the interconnect opening.

3. The method of claim 1, wherein the oxygen-containing organosilicon compound is a siloxane selected from the group of tetrasthoxysilane (TEOS), triethoxyfluorosilane (TEFS), 1,3,5,7-tetramethylcyclotetrasiloxane (TMCTS), dimethyldiethoxy silane (DMDE), octomethylcyclotetrasiloxane (OMCTS), and combinations thereof.

4. The method of claim 1, wherein the acidic compound is an organic acid having one or more carboxylate groups.

5. The method of claim 4, wherein the organic acid is selected from the group of citric acid, acetic acid, formic acid, and combinations thereof.

6. A method of processing a substrate, comprising:
depositing a dielectric layer on a surface of the substrate;
depositing an acidic anti-reflective coating on the dielectric layer by reacting an oxygen-containing organosilicon compound and an acidic compound, wherein the flow rate ratio of the oxygen-containing organosilicon compound to acidic compound is between about 5:1 and about 200:1;
depositing a photoresist material on the acidic anti-reflective coating; and
patterning the photoresist layer.

7. The method of claim 1, wherein the etch selectivity of acidic dielectric material and dielectric layer is about 1:1.

8. A method for processing a substrate, comprising:
depositing a barrier layer on a substrate surface;
depositing at least one dielectric layer on a substrate surface;
depositing a first photoresist material on the at least one dielectric layer;
patterning the first photoresist layer to define a via for a feature definition;
etching the at least one dielectric layer to define a via definition;
depositing an acidic opaque material in the via definition by:
generating a plasma; and
reacting an oxygen-containing organosilicon compound and an acidic compound in the plasma;
depositing a second photoresist material on the at least one dielectric layer and the acidic opaque material;
patterning the second photoresist layer to define a trench for the feature definition;
etching the at least one dielectric layer and the acidic opaque material to define a trench definition; and
removing any remaining acidic opaque material and second photoresist material from the feature definition.

9. The method of claim 8, further comprising:
depositing one or more conductive materials; and
planarizing the one or more conductive materials and the at least one dielectric layer.

10. The method of claim 8, wherein the oxygen-containing organosilicon compound is a siloxane selected from the group of tetraethoxysilane (TEOS), triethoxyfluorosilane (TEFS), 1,3,5,7-tetramethylcyclotetrasiloxane (TMCTS), dimethyldiethoxy silane (DMDE), octomethylcyclotetrasiloxane (OMCTS), and combinations thereof.

11. The method of claim 8, wherein the flow rate ratio of the oxygen-containing organosilicon compound to acidic compound is between about 5:1 and about 200:1.

12. The method of claim 8, wherein the etch selectivity of acidic opaque material and dielectric layer is about 1:1.

13. The method of claim 8, wherein the acidic compound is an organic acid having one or more carboxylate groups.

14. The method of claim 13, wherein the organic acid is selected from the group of citric acid, acetic acid, formic acid, and combinations thereof.

15. A method for processing a substrate, comprising:
depositing a barrier layer on a substrate surface;
depositing at least one dielectric layer on a substrate surface;
depositing a first photoresist material on the at least one dielectric layer;
patterning the first photoresist layer to define a trench for a feature definition;
etching the at least one dielectric layer to define a trench definition;
depositing an acidic opaque material in the trench definition by:
generating a plasma; and
reacting an oxygen-containing organosilicon compound and an acidic compound in the plasma;
depositing a second photoresist material on the at least one dielectric layer and the acidic opaque material;
patterning the first photoresist layer to define a via for the feature definition;
etching the at least one dielectric layer and the acidic opaque layer to define a via definition; and
removing any remaining acidic opaque material and second photoresist material from the feature definition.

16. The method of claim 15, further comprising:
depositing one or more conductive materials; and
planarizing the one or more conductive materials and the at least one dielectric layer.

17. The method of claim 15, wherein the oxygen-containing organosilicon compound is a siloxane selected from the group of tetraethoxysilane (TEOS), triethoxyfluorosilane (TEFS), 1,3,5,7-tetramethylcyclotetrasiloxane (TMCTS), dimethyldiethoxy silane (DMDE), octamethylcyclotetrasiloxane (OMCTS), and combinations thereof.

18. The method of claim 15, wherein the flaw rate ratio of the oxygen-containing organosilicon compound to acidic compound is between about 5:1 and about 200:1.

19. The method of claim 15, wherein the etch selectivity of acidic opaque material and dielectric layer is about 1:1.

20. The method of claim 15, wherein the acidic compound is an organic acid having one or more carboxylate groups.

21. The method of claim 20, wherein the organic acid is selected from the group of citric acid, acetic acid, formic acid, and combinations thereof.

* * * * *

UNITED STATES PATENT AND TRADEMARK OFFICE
CERTIFICATE OF CORRECTION

PATENT NO.         : 7,115,534 B2
APPLICATION NO. : 10/847891
DATED              : October 3, 2006
INVENTOR(S)       : Nguyen et al.

It is certified that error appears in the above-identified patent and that said Letters Patent is hereby corrected as shown below:

Column 4, Line 52: Change "dimethyidiethoxy" to --dimethyldiethoxy--

Column 4, Line 53: Delete the second instance of "suitable"

Column 5, Line 26: Change "free" to --oxygen-free--

Column 6, Line 30: Delete "power levels may be"

Column 6, Lines 37-38: Delete "power levels may be"

Column 6, Line 63: Delete the second instance of "such as"

Column 7, Line 4: Before "acidic", change "a" to --an--

Column 10, Line 22: Change "my" to --may--

Column 12, Line 32: Before "a", delete "the"

Column 14, Lines 1-2: Delete "pattern the"

Column 17, Line 46: Before "DARC", change "The" to --the--

Column 18, Line 28: Change "Producers$^{TM}$" to --Producer$^{TM}$--

Column 20, Claim 18, Line 55: Change "flaw" to --flow--

Signed and Sealed this

Sixteenth Day of January, 2007

JON W. DUDAS
*Director of the United States Patent and Trademark Office*